(12) United States Patent
Naseem et al.

(10) Patent No.: US 7,202,143 B1
(45) Date of Patent: Apr. 10, 2007

(54) LOW TEMPERATURE PRODUCTION OF LARGE-GRAIN POLYCRYSTALLINE SEMICONDUCTORS

(75) Inventors: Hameed A. Naseem, Fayetteville, AR (US); Marwan Albarghouti, Loudonville, NY (US)

(73) Assignee: The Board of Trustees of the University of Arkansas, Little Rock, AR (US)

( * ) Notice: Subject to any disclaimer, the term of this patent is extended or adjusted under 35 U.S.C. 154(b) by 0 days.

(21) Appl. No.: 10/972,760

(22) Filed: Oct. 25, 2004

Related U.S. Application Data

(60) Provisional application No. 60/513,670, filed on Oct. 23, 2003.

(51) Int. Cl.
*H01L 21/20* (2006.01)
*H01L 29/76* (2006.01)

(52) U.S. Cl. .................................. 438/486; 257/66
(58) Field of Classification Search ............ 257/52–58, 257/62–66; 438/482, 486, 597, 682
See application file for complete search history.

(56) References Cited

U.S. PATENT DOCUMENTS

| | | | | |
|---|---|---|---|---|
| 4,448,632 A | * | 5/1984 | Akasaka | 438/413 |
| 5,700,333 A | * | 12/1997 | Yamazaki et al. | 136/258 |
| 5,930,675 A | * | 7/1999 | Hada | 438/647 |
| 5,940,693 A | * | 8/1999 | Maekawa | 438/166 |
| 6,097,037 A | | 8/2000 | Joo et al. | |
| 6,277,714 B1 | | 8/2001 | Fonash et al. | |
| 6,312,979 B1 | | 11/2001 | Jang et al. | |
| 6,326,226 B1 | | 12/2001 | Jang et al. | |
| 6,332,967 B1 | * | 12/2001 | Bhattacharya | 205/51 |
| 6,486,496 B2 | | 11/2002 | Chang et al. | |
| 6,537,898 B1 | | 3/2003 | Lee et al. | |
| 6,569,715 B1 | | 5/2003 | Forbes et al. | |
| 6,613,653 B2 | | 9/2003 | Naseem et al. | |
| 6,642,131 B2 | * | 11/2003 | Harada | 438/591 |

OTHER PUBLICATIONS

Haque, M., et al., "Interaction of aluminum with hydrogenated amorphous silicon at low temperatures," *J. Appl. Phys.*, (1994) 75(8): 3928-3935.
Radnoczi, G., et al., "Al induced crystallization of a-Si," *J. Appl. Phys.*, (1991) 69(9): 6394-6399.
Robertson, A., et al., "Metal induced crystallization of amorphous silicon," *J. Vac. Tech. A*, (1987) 5(4): 1447-1450.
Lee, S., et al., "Pd induced lateral crystallization of amorphous Si thin films," *Appl Phys. Lett.*, (1995) 66(13): 1671-1673.

(Continued)

*Primary Examiner*—Calvin Lee
(74) *Attorney, Agent, or Firm*—Medicus Associates; James H. Meadows

(57) ABSTRACT

An oxide or nitride layer is provided on an amorphous semiconductor layer prior to performing metal-induced crystallization of the semiconductor layer. The oxide or nitride layer facilitates conversion of the amorphous material into large grain polycrystalline material. Hence, a native silicon dioxide layer provided on hydrogenated amorphous silicon (a-Si:H), followed by deposited Al permits induced crystallization at temperatures far below the solid phase crystallization temperature of a-Si. Solar cells and thin film transistors can be prepared using this method.

27 Claims, 7 Drawing Sheets

OTHER PUBLICATIONS

Yoon, S., et al., "Low temperature solid phase crystallization of amorphous silicon at 380° C.," *J. Appl. Phys.*, (1998) 84(11): 6463-6465.

Lee, S., et al., "Low temperature poly-Si thin-film transistor fabrication by metal-induced lateral crystallization," *IEEE Electron Devices Lett.*, (1996) 17: 160-162.

Wong, M., et al., "Characterization of the MIC/MILC interface and its effects on the performance of MILC thin-film transistors," *IEEE Electron Devices*, (2000) 47(5): 1061-1067.

Murley, D. et al., "An investigation of laser annealed and metal-induced crystallized polycrystalline silicon thin-film transistors," *IEEE Electron Devices*, (2001) 48(6): 1145-1151.

Widenborg, P., et al., "Surface morphology of poly-Si films made by aluminum-induced crystallization on glass substrates," *J. Crystal Growth*, (2002) 242: 270-282.

Widenborg, P., et al., "Back electrode formation for poly-Si thin film solar cells on glass having AIC-grown seeding layer," *Solar Energy Matls. & Solar Cells*, (2002) 74: 305-314.

Konno, T., et al., "Crystallization of silicon in aluminium/amorphous-silicon multilayers," *Phil. Mag. B*, (1992) 66(6): 749-765.

Masaki, Y., et al., "Kinetics of solid phase interaction between Al and a-Si:H," *J. Appl. Phys.*, (1994) 76(9): 5225-5231.

Kim, J., et al., "Al-induced crystallization of an amorphous Si thin film in a polycrystalline Al/native SiO2/amorphous Si structure," *Jpn. J. Appl. Phys.*, (1996) 35: 2052-2056.

Ashtikar, M., et al., "Silicide mediated low temperature crystallization of hydrogenated amorphous silicon in contact with aluminum," *J. Appl. Phys.*, (1995) 78(2): 913-918.

Guliants, E., et al., "Characterization of poly-Si thin films deposited by magnetron sputtering onto Ni prelayers," *J. Appl. Phys.*, (2000) 87(7); 3532-3536.

Nast, O., et al., "Influence of interface and Al structure on layer exchange during aluminum-induced crystallization of amorphous silicon," *J. Appl. Phys.* (2000) 88(2): 716-724.

\* cited by examiner

LOW TEMPERATURE PRODUCTION OF LARGE-GRAIN POLYCRYSTALLINE SEMICONDUCTORS

CROSS-REFERENCE TO RELATED APPLICATION

The present application claims the benefit of priority of U.S. Provisional Application 60/513,670, filed Oct. 23, 2003, the disclosure of which is incorporated herein by reference.

STATEMENT OF GOVERNMENT SUPPORT

Development of this invention was supported at least in part by the U.S. Department of Energy through DOE/EPSCOR grant 0402-03027-21-0000. The Government may have certain rights in the invention.

BACKGROUND OF THE INVENTION

Silicon (Si) has been and still is the center of attention for much work in the world of semiconductors and is still the material of choice for most semiconductor applications. Among the reasons for this are the relative ease of growing c-Si and poly-Si compared to other materials, the relative low number of defects that usually accompany this growth, and finally, the ease of growing $SiO_2$ on Si, which furnishes a dielectric/Si interface with very unique characteristics that make Si far more superior than other semiconductor materials. Recently, Si has gained even more momentum with the advent of epitaxial growth of SiGe and SiC alloys, which may open up the door for Si to emerge as a material of choice for many new applications that were long dominated by the III-V semiconductors.

Amorphous Si (a-Si) has its share of applications and research on a-Si intensified after the arrival of hydrogenated amorphous Si (a-Si:H) in the late 1960s. It was observed that this new material has a much lower defect density than its unhydrogenated counterpart. This was a major improvement in the area of amorphous semiconductor research because it made doping amorphous Si a possibility that was not possible in unhydrogenated silicon. Further research showed that the material had good electrical conductivity with relatively high carrier mobility. In the mid 1970s, reports on n-type and p-type doping of this material were published, which triggered an increased interest in this form of amorphous silicon. Currently, a-Si:H has many commercial applications, for example, in TFTs, the switching elements in most Active Matrix Liquid Crystal Display (AMLCD). Also, a-Si is known to have a pseudo-direct band gap and high absorption coefficient, which makes it suitable for solar cell fabrication.

One of the very attractive features of a-Si:H is that it can be easily deposited at low temperatures as a thin film on large areas. This feature made it a very suitable material in other commercial applications, such as scanners and FAX arrays. It also motivated researchers in the last twenty years or so to come up with methods to crystallize a-Si thin films to obtain low-temperature large area poly-Si thins. Most a-Si:H films are deposited by plasma-enhanced chemical vapor deposition (PECVD). In PECVD, silane gas is introduced into a reaction chamber while a plasma of charged particles is sustained inside by the acceleration of electrons and ions between two electrodes. These accelerated particles collide with the gas molecules causing them to break up into radicals that react at the substrate causing a film of hydrogenated silicon to grow. It is generally known that the hydrogen content of an a-Si:H film increases as the deposition temperature is decreased. The hydrogen content can vary from 40 to 10 at % as the substrate temperature is raised. The defect density in the film is inversely proportional to this content for substrate temperatures above 200–250° C. Also, the defect density increases for substrate temperatures below 200° C. Generally, there are around $10^{15}$ $cm^{-3}$ defect states in an a-Si:H film deposited at 250° C. substrate temperature compared to $10^{20}$ $cm^{-3}$ in non-hydrogenated film.

Polycrystalline Si (poly-Si) has also been an attractive material for many years. It has been used in many electronic applications such as MOS devices where heavily-doped poly-Si can serve as a gate material or for interconnecting. Poly-Si has also been extensively used in fabricating solar cells and, most recently, for thin film transistors (TFTs), which give them higher carrier mobility as compared to amorphous Si-based TFTs. Polysilicon thin film is now attracting a great deal of research and interest in the semiconductor industry because of its superior electronic properties as compared to its amorphous counterpart. Several technologies are available now to produce poly-Si thin films. These technologies are competing to achieve the best quality poly-Si through producing poly-Si with large grain size and high carrier mobility. It is known that the larger the grain size in the poly-Si thin film, the lower the number of defect states in the band gap. The states in the band gap are actually trap states for carriers that are introduced when the long range order in the Si matrix is disrupted. These trap states are present in the grain boundaries. Therefore, reducing the total area of the grain by achieving larger grains reduces the density of the trap states and this enhances the performance of the poly-Si based device significantly.

Solid phase crystallization (SPC) is one method used to convert a-Si to poly-Si. In this method a-Si thin film is deposited at low pressures in a CVD system by thermal decomposition of silane. The substrate is kept at a relatively high temperature of about 600° C. With further heat treatment above 600° C. after deposition, crystallites start to form, which converts the film into poly-Si. The grains increase in size upon heat treatment in furnaces at higher temperatures. The high temperature is needed to help the Si—Si bonds break in the amorphous network and reform, but in a more periodic manner. Larger grains are desirable in thin films. In order to realize a good quality film with large grains, temperatures as high as 1000° C. are sometimes necessary. Using this method, grains as large as 5 μm can be realized. It is still the preferred method to obtain poly-Si films, however its main disadvantage is that it requires high annealing temperatures and annealing times in tens of hours. The high annealing temperatures can be destructive to various device constructs.

A novel method used to produce poly-crystalline silicon thin films is metal-induced crystallization (MIC), which produces poly-silicon thin films by interacting amorphous Si thin films with metals such as Al, Au, Pd, Ag, Ni or Cr. MIC permits crystallizing a-Si at much lower temperatures compared to the temperatures of solid-phase crystallization (SPC) of Si. Temperatures as low as 150° C. have been reported [M. Haque, et al., *J. Appl. Phys.*, 75(8): 3928 (1994)], and metals, such as Al [G. Radnoczi, et al., *J. Appl. Phys.* 69(9): 6394 (1991)], Ag [A. Robertson, et. al., *J. Vac. Tech. A*, 5(4): 1447 (1987)], Pd [S. Lee, et al., *Appl Phys. Lett.*, 66(13): 1671 (1995)] and Ni [S. Yoon, et al., *J. Appl. Phys.*, 84(11): 6463 (1998)] are commonly used for this purpose. As far as cost is concerned, MIC is the most economical method for producing good quality poly-silicon (poly-Si) with high throughput.

Results on thin-film transistors (TFTS) fabricated using this method have been reported [S. Lee et al., *IEEE Electron Devices Lett.*, 17: 160 (1996)]. They are interesting and have triggered more research on this subject [M. Wong, et. al., *IEEE Electron Devices*, 47(5): 1061 (2000); D. Murley, et. al., *IEEE Electron Devices*, 48(6): 1145 (2001)], and now, complete TFTs can be fabricated by combining vertical MIC and lateral MIC of a-Si. MIC has also been studied for applications in the production of solar cells using Al and other metals to prepare poly-Si seed layers on glass at low temperature [P. Widenborg et al., *J. Crystal Growth*, 242: 270–282 (2002); P. Widenborg et al., *Solar Energy Matls. & Solar Cells*, 74: 305–314 (2002)].

MIC represents a challenge to material scientists as far as understanding the mechanism is concerned. While the fast diffusion of Al in a-Si seems to be a reasonable and consistent explanation for low temperature MIC, Si solubility in Al, although finite, can be another explanation. Several models have been proposed to explain this phenomenon for Al [M. Haque, ibid, T. Konno et al., *Phil Mag. B*, 66(6): 749 (1992); Y. Masaki, et al., *J. Appl. Phys.*, 76(9): 5225 (1994); J. Kim et al., *Jpn. J. Appl. Phys.*, 35: 2052 (1996); M. Ashtikar et al., *J. Appl. Phys.*, 78(2): 913 (1995)] and Ni [S. Yoon, et al., *J. Appl. Phys.*, 84(11): 6463 (1998); E. Guliants et al., *J. Appl. Phys.*, 87(7): 6463 (2000)], and they all seem to agree that the interaction starts at the interface between the Si layer and the metal.

The role that the interface plays in the mechanism of MIC has not been fully studied. Among the first to comment on its role were Kim and Lee [Kim et al., ibid] who studied structures of poly-Al/native $SiO_2$/a-Si. They observed that the crystallization occurred even though a 2 nm thick native oxide was present. The proposed model depends mainly on the mechanism of inter-diffusion. This mechanism involves the diffusion of Si atoms into the Al layer and the diffusion of Al into the Si layer. On the other hand, Nast [O. Nast et al., *J. Appl. Phys.* 88(2): 716 (2000)] studied the effect of native alumina in layered Al/a-Si/Al structures and observed that the presence of this layer had the strongest effect on the overall crystallization process compared to other parameters. In this paper, the crystallization of samples that have different thicknesses of native $SiO_2$ on their a-Si:H layer was quantitatively compared using x-ray diffraction (XRD), and then, qualitatively using scanning electron microscopy (SEM). The crystallization rates of the samples as a function of the oxide thickness were compared and the crystallinity of the samples was examined by SEM. In both cases it was found that the presence of the native oxide layer strongly affects crystallization.

Several patent references propose methods of promoting crystallization of a-Si using an applied metal layer. Representative of these is U.S. Pat. No. 6,277,714 (issued to Fonash et al.), which proposes inducing crystallization of a-Si by pressing a metal layer into physical contact with the a-Si layer and applying heat. U.S. Pat. No. 6,537,898 (issued to Lee et al.) proposes forming a poly-Si layer using a silicon-metal composite layer in which the metal acts as a catalyst for crystallization. U.S. Pat. Nos. 6,339,013 and 6,613,653 (issued to Naseem et al.) propose low temperature methods of forming semiconductor device, with or without a doping metal, using MIC. U.S. Pat. No. 6,486,496 (issued to Chang et al.) proposes forming poly-Si layers on TFTs using metal-induced lateral crystallization (MILC).

An object of the present invention is the development of new methods and articles of manufacture permitting low temperature crystallization of a-Si. Such methods and devices are expected to have applications to solar cells, transistors, and the like.

SUMMARY OF THE INVENTION

It has now been found that formation of a thin oxide layer on an amorphous semiconductor, followed by application of a metal layer and annealing, leads to formation of large-grain crystallites in the previous amorphous layer. Hence, an amorphous region of a semiconductor can be converted to an at least partially crystalline region by: (i) at least partially oxidizing the amorphous region of the semiconductor; (ii) applying a contact metal to a surface of the at least partially oxidized amorphous region; and (iii) annealing the resulting metallized semiconductor under conditions effective to convert the at least partially oxidized amorphous region to the at least partially crystalline region. An annealing temperature in the range 100–550° C., more preferably 150–450° C., can be employed in the process and the resultant at least partially crystalline region of the semiconductor has a typical average grain size in the range 1–20 microns. Preferably, the amorphous semiconductor material is a-Si and the resultant partially crystalline material is poly-Si.

In another aspect contemplated by the invention, a thin nitride layer is applied to an amorphous region of a semiconductor, followed by metallization and annealing to afford an at least partially crystalline region of the semiconductor.

Another aspect of the invention contemplates formation of a solar cell by partially oxidizing or depositing an oxide or nitride layer onto a semiconductor layer on a substrate, followed by depositing a contact metal onto the formed oxide or nitride layer, and annealing the metallized semiconductor so as to form a p-n junction. Upon removal of the metal layer, the p-layer comprises a partially crystalline phase having an average grain size greater than about 1 micron and less than about 40 microns.

In yet another aspect of the invention, a TFT comprises a polycrystalline phase for the p-doped region of the transistor. The polycrystalline phase is produced by the methods of the present invention and has average grain sizes greater than about 1 micron and less than about 40 microns.

These and other aspects of the present invention will be apparent from the discussion that follows hereinbelow.

DETAILED DESCRIPTION OF THE INVENTION

Figure 1:
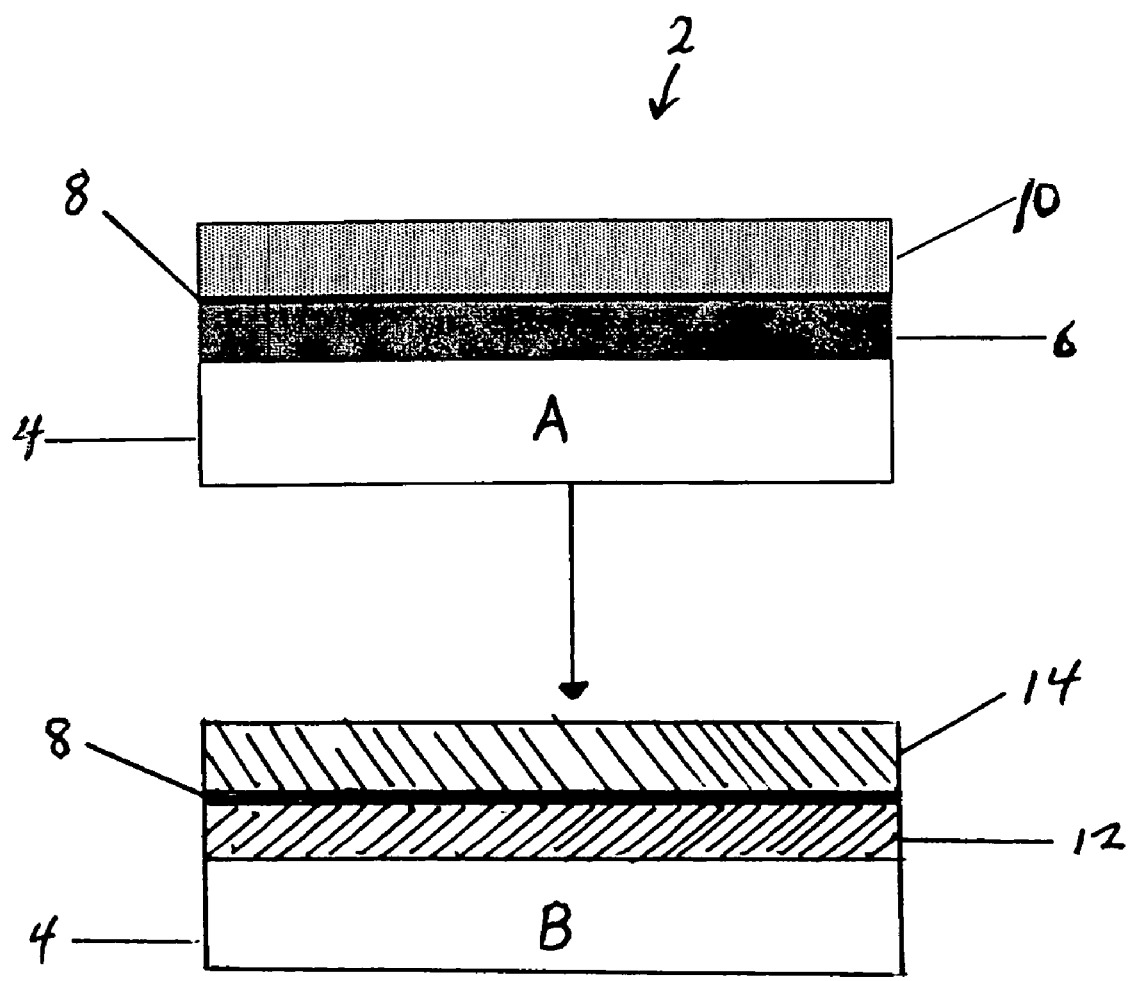
FIG. 1 illustrates a generic aspect of the present invention in which amorphous semiconductor, oxide layer and contact metal layer on a substrate (A) are annealed to form construct B, which has polycrystalline semiconductor phases.

The present invention pertains to improved processes and semiconductor devices in which an amorphous region of a semiconductor is converted to an at least partially crystalline region. As used herein, the term "amorphous region", and its equivalents, refers to a structural region of a semiconductor material that has a substantially noncrystalline solid state, such as is found in a-Si. As used herein, the term "partially crystalline region", and its equivalents, refers to a region of a semiconductor substantially coextensive with an aforesaid amorphous region, but which shows some extrinsic indication of crystallinity, such as by X-ray diffraction (XRD) methods.

The term "semiconductor", as used herein, refers to such semiconductors as silicon, germanium, silicon-germanium alloys, silicon-carbon alloys, germanium-carbon alloys, silicon-nitrogen alloys, gallium arsenide, cadmium telluride, copper-indium-diselenide, copper-indium-gallium-diselenide, copper-indium-disulfide, copper sulfide, copper telluride, zinc phosphide, indium selenide, and indium phosphide. Typically, the semiconductor employed with the present invention is silicon, in which case an afore-mentioned amorphous region is amorphous silicon (a-Si) and an at least partially crystalline region is polycrystalline silicon (poly-Si). Preferably, a-Si is hydrogenated, i.e., H-passivated, prior to oxidation.

Generally, the semiconductor employed in the present invention is provided as a layer on a suitable substrate. That is, a semiconductor layer can be deposited on the substrate, e.g., glass, plastic, metal sheet or film, silicon or sapphire, prior to oxidizing the semiconductor layer. The deposition of semiconductor can be performed by chemical vapor deposition, plasma vapor deposition, evaporation or sputtering. The resultant thickness of the semiconductor layer is typically in the range 100 to 500,000 Å, and is more typically in the range 1000 to 20,000 Å, depending on application.

A manufacturing process of the present invention comprises at least partially oxidizing an amorphous region of a semiconductor. Such oxidation can take place by contacting the semiconductor with ambient air, performing the oxidation under illumination, by contacting the semiconductor with liquid water or water vapor, or a combination of these. An oxide layer so formed on the amorphous semiconductor typically has a layer thickness in the range of about 5 to 20 Å, i.e., 0.5 to 2.0 nm.

When c-Si is exposed to air at room temperature, it reacts with oxygen and forms a thin layer of oxide ($SiO_2$). This film, sometimes called native oxide, is amorphous and has a thickness of 0.5 nm after 5 minutes, 2 nm after 15 hours and 4–5 nm after one year. Poly-Si and a-Si:H are also expected to form native oxides of the same thickness. Hydrogenated a-Si (a-Si:H) is known to have its dangling bonds on the surface terminated or passivated by H atoms. This is why oxide growth on the surface of a-Si:H is normally slower than on a c-Si surface. The native oxide thickness on an a-Si:H surface was found to be between 0.5–1.0 nm after a few days, compared to 2 nm for c-Si.

Once an amorphous region of a semiconductor has been at least partially oxidized, a contact metal is applied to a surface of the at least partially oxidized amorphous region. Such application can be performed by chemical vapor deposition, plasma vapor deposition, evaporation, or sputtering. A preferred contact metal for use in this respect is selected from aluminum, nickel, copper, silver, gold and palladium. The method of application is suitably selected as appropriate for the chosen metal. A layer of the applied contact metal has a thickness of about 10 to 20,000 Å, more preferably about 100 to 10,000 Å.

As depicted in FIG. 1, a representative construct of the invention 2 comprises substrate 4 on which is formed amorphous semiconductor layer 6. Oxide layer 8 is deposited thereon and metal layer 10 is applied. After annealing, construct A is converted to construct B. Thus, amorphous semiconductor 6 is converted to polycrystalline layer 12. Concurrently, metal layer 10 is converted to distinct polycrystalline layer 14.

Aluminum has long been used for metal interconnects in the semiconductor industry. It has many advantages over other metals; the most important being that it adheres to the Si surface better than any other metal. This is because it is a very reactive metal with silicon oxide. It can easily react with a silicon oxide layer formed on a Si surface to form aluminum oxide.

After application of the contact metal layer, the metallized semiconductor, so formed, is annealed under conditions effective to convert the at least partially oxidized amorphous region to an at least partially crystalline region. Typically, the annealing conditions include an annealing temperature in the range 100–550° C., more preferably 150–450° C. An annealing time is typically in the range of 1 second to 1 day and is preferably in the range of 1 minute to 1 hour. For the work described herein, most annealing is performed at temperatures below 450° C. Hence, transformation of the oxide layer from $SiO_2$ to $Al_2O_3$ may not be of a great concern. Even if a transformation occurs, it most likely results in the formation of an $Al_2O_3$ layer that is only a few angstroms thick, around 0.2–0.5 nm.

Generally, a region of a semiconductor that is amorphous is the entirety of the semiconductor, e.g., semiconductor layer. Depending on conditions, the entirety of the semiconductor may or may not be converted, after annealing, to a partially crystalline region. An average grain size for an at least partially crystalline region of a semiconductor prepared as set forth herein is preferably in the range of about 1 to about 40 microns, with larger grain sizes generally being preferred.

In most applications, e.g., solar cells, the contact metal layer applied to the oxide layer serves only temporarily to effect low temperature crystallization of the semiconductor, and the metal layer is removed following annealing. Such removal is conveniently performed by wet or dry etching. The steps of annealing and etching are illustrated schematically in FIG. 2 for two samples; one having an oxide layer intermediate a semiconductor and Al layer (Oxide) and the other having no such oxide layer (RA). After annealing, polycrystalline semiconductor is formed in the former amorphous layer as well as the former Al layer. After etching residual Al metal, the RA construct is more porous than the Oxide construct.

The semiconductor can be doped with an n-type or p-type dopant, as desired, prior to application of the contact metal layer, and preferably prior to oxidizing the semiconductor surface. Most preferably, doping is performed during deposition of the semiconductor on a substrate.

An alternative approach taken by the present invention entails depositing an oxide or nitride layer onto an amorphous region of a semiconductor. Such deposition can be performed by chemical vapor deposition or plasma vapor deposition. As before, contacting of a metal to a surface of the deposited oxide or nitride layer is followed by annealing the metallized semiconductor under conditions effective to convert the amorphous region of the semiconductor to an at least partially crystalline region.

In this latter approach, a deposited oxide or nitride layer typically comprises an oxide of silicon, aluminum or other metal, and the nitride layer comprises a nitride of silicon, aluminum or other metal.

Semiconductor devices can be prepared with a method of the present invention. For instance, in making a solar cell, a semiconductor layer is deposited on a suitable substrate, an amorphous region of the semiconductor is partially oxidized, a contact metal is deposited onto the oxide layer, and the metallized semiconductor is annealed under conditions effective to produce a p-n junction, as required to support electron-hole separation upon illumination. Some diffusion of contact metal atoms into the amorphous region can be expected, so as to effect p-type doping of the semiconductor. For such diffusion to occur, the metal atoms must penetrate the oxide or nitride layer provided intermediate the semiconductor and the contact metal. Very few studies have quantitatively described the diffusion of Al in $SiO_2$. But most of these studies have shown that Al diffusion in $SiO_2$ is a very slow process, yet it is still much faster than the diffusion of Si in $SiO_2$.

After annealing, the metal layer is removed to afford a p-layer that comprises a partially crystalline phase having an average grain size greater than about 1 micron and less than about 40 microns. Likewise, a solar cell can be prepared by depositing an oxide layer onto the semiconductor layer, with subsequent deposition and annealing steps performed as before. Alternatively, a nitride layer can be deposited.

A solar cell obtained according to principles of the present invention comprises a substrate and a semiconductor deposited onto the substrate. The semiconductor comprises (i) an n-type phase proximal the substrate, and (ii) a p-type polycrystalline phase distal the substrate. The p-type doping of the polycrystalline phase can be achieved directly by migration of metal atoms, e.g., Al atoms, from the applied contact metal layer during annealing. The p-type polycrystalline phase of the semiconductor has an average grain size as produced by the present invention, i.e., greater than about 1 micron and less than about 40 microns, more typically, greater than about 5 microns and less than about 20 microns. Typically, a solar cell prepared according to the principles of the present invention has an n-type phase comprising a-Si and the p-type phase comprises poly-Si.

A substrate for a solar cell can be a conductive material or have a conductive coating thereon. A typical substrate comprises glass, plastic, metal sheet or film, silicon, or sapphire. The solar cell can also be provided with a window layer deposited onto the semiconductor layer, and can also be provided with an absorber layer intermediate the n-type phase and the p-type phase.

Figure 3:
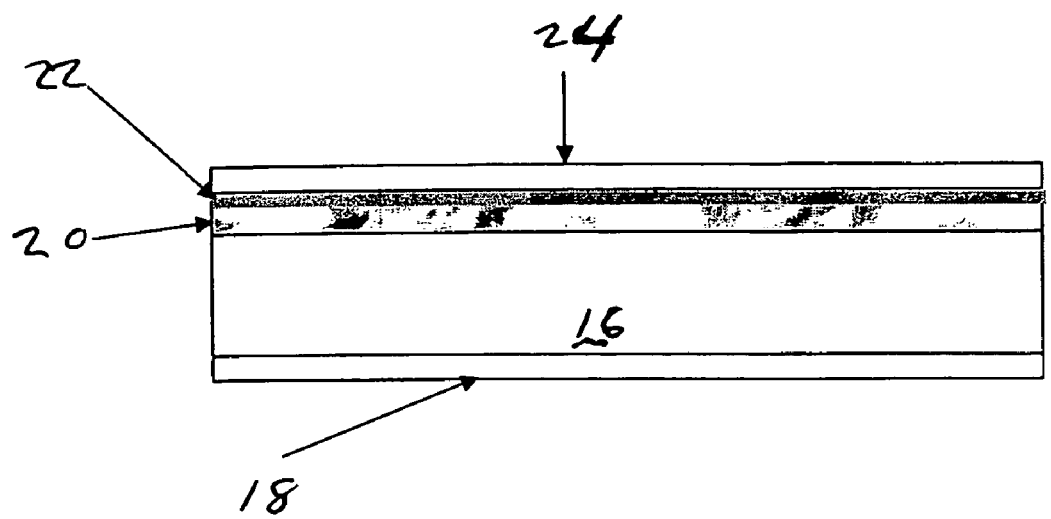
FIG. 3 depicts a first solar cell construct prior to metal removal as prepared according to principles of the present invention.

A representative solar cell prepared according to the present invention is depicted in FIG. 3. Silicon substrate (n-type) 16 has back contact 18 on one side, and on the opposing side is large-grain crystallized p-type polysilicon layer 20. Oxide layer 22 separates polysilicon layer 20 from metal layer 24. Metal layer 24 can be removed by wet or dry etching.

Figure 4:
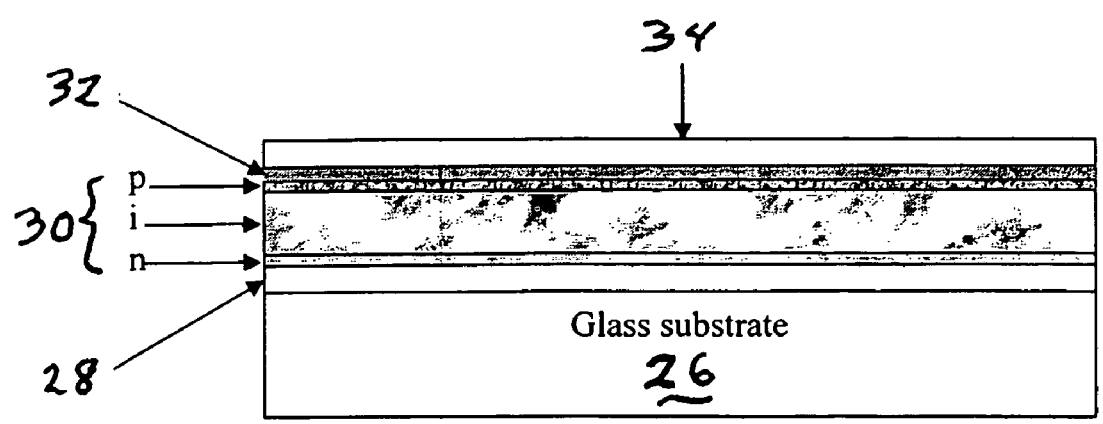
FIG. 4 depicts a second solar cell construct prepared according to principles of the present invention.

A second solar cell contemplated within the present invention is depicted in FIG. 4. The solar cell has a substrate 26 with a textured transparent conducting oxide 28 formed thereon. Large-grain crystallized polysilicon layer 30 is formed on the conducting oxide and is comprised of n-type polysilicon, intrinsic-type polysilicon, and p-type polysilicon. For such a solar cell, the first n-type layer proximal the substrate has an electron donor concentration greater than about $1.0 \times 10^{16}$ and less than about $1.0 \times 10^{22}$ and the second intrinsic-type layer proximal the first layer has an electron donor concentration greater than about $1.0 \times 10^{12}$ and less than about $1.0 \times 10^{14}$. The first, second and third polycrystalline semiconductor layers each have an average grain size greater than about 1.0 micron and less than about 40 microns, and fabrication of the semiconductor layers with the stated average grain size is accomplished without exceeding temperatures in the range of 150–450° C., which could reduce the solar conversion efficiency of the solar cell. Oxide layer 32 is deposited on the polysilicon sublayers and is topped with metal layer 34. In this construct, a front conductor can be placed in electrical contact with the third semiconductor layer and is arranged to at least partially admit light to the underlying semiconductor layers.

Figure 5:
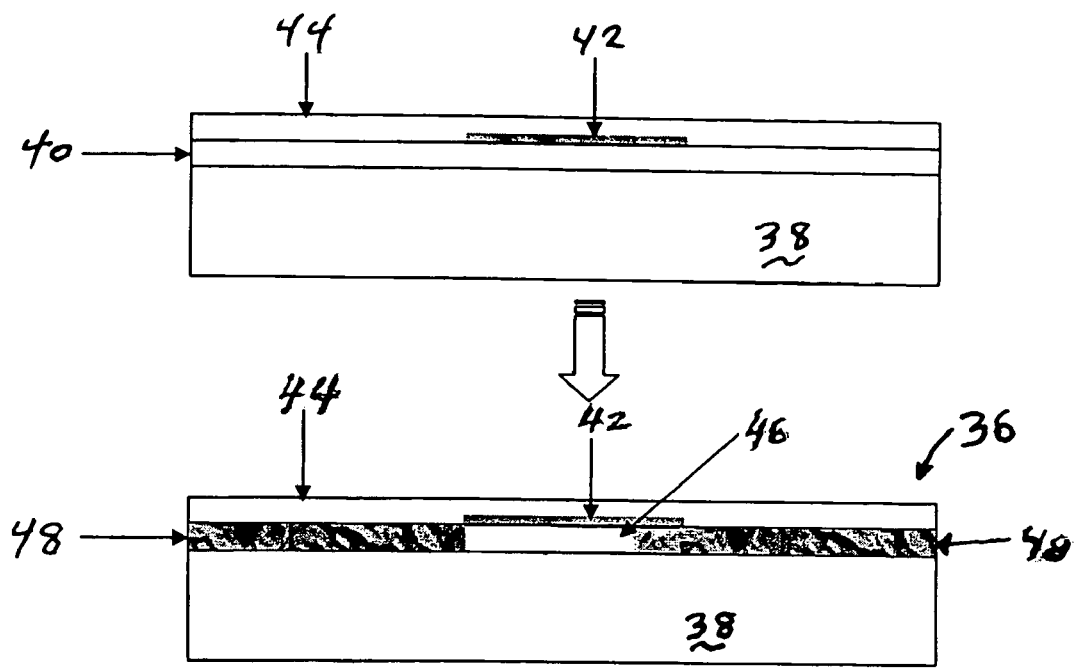
FIG. 5 depicts steps for formation of an n-channel TFT according to principles of the present invention.

Also contemplated within the present invention are thin film transistors (TFTs). An exemplary p-n-p type (n-channel) TFT 36 is formed in situ by diffusion of Al atoms from adjacent Al metal layers, as shown in FIG. 5. The TFT comprises an insulating glass substrate 38 and lightly n-type amorphous silicon layer 40 formed thereon. Narrow oxide layer 42 is deposited thereon and metal layer 44 is deposited over the entire amorphous silicon layer. After annealing, TFT 36 comprises n-type large-grain silicon channel 46 and p-type polysilicon source and drain regions 48 adjacent the gate region. In this device, the source and drain regions are contacted with a metal that diffuses into those regions during annealing, thereby affording p-type doping concurrent with converting the semiconductor in those regions from an amorphous phase into a polycrystalline phase. The gate region, which has a width of about 0.1 to 5 microns (100 to 5000 nm), also comprises a polycrystalline phase formed by MIC by virtue of being proximal the source and drain regions; however, the gate region is not doped as heavily as the p-type regions due to less migration of metal atoms into this region. The contact metal is removed, e.g., by etching, after annealing. An average grain size for the polycrystalline phases mentioned is greater than about 1 micron and less than about 40 microns, and is more preferably greater than about 5 microns and less than about 20 microns.

Figure 6:
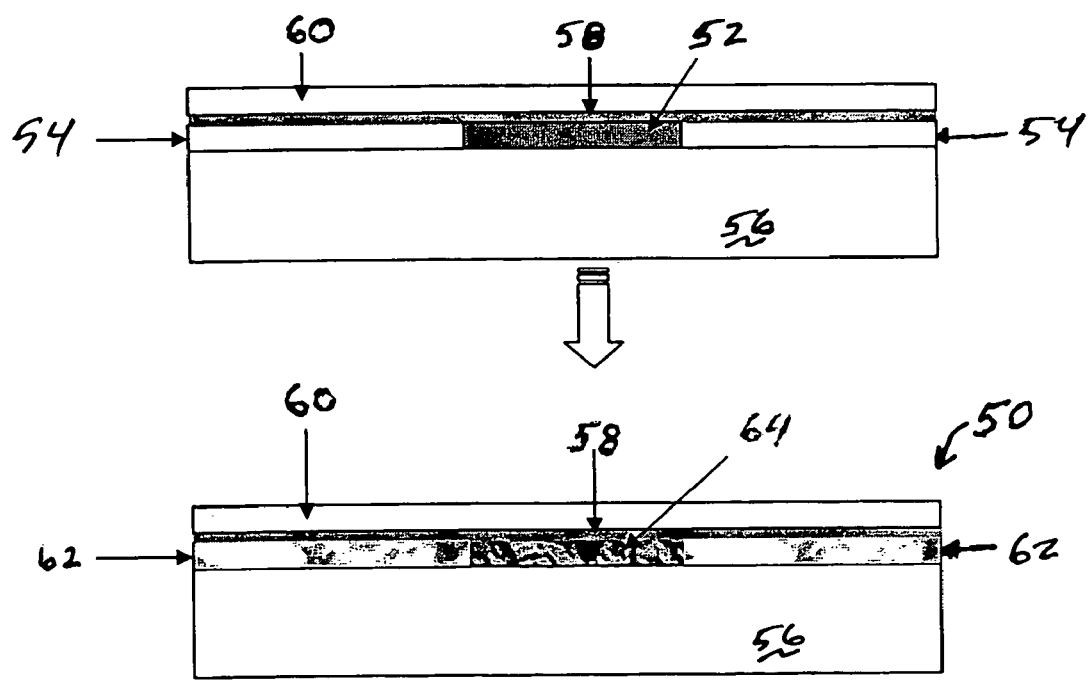
FIG. 6 depicts formation of a p-channel TFT according to principles of the present invention.

An n-p-n type (p-channel) TFT 50 is depicted in FIG. 6. The TFT comprises device structures analogous to those for a p-n-p type; however, in this construct gate region 52 is p-doped. A lightly n-doped amorphous silicon layer 54 is applied to substrate 56 and adjacent the gate region. Oxide layer 58 and metal layer 60 are contacted with the silicon layer proximate the predefined gate region and annealing is conducted. After annealing, amorphous region 54 is converted to n-type polysilicon source and drain regions 62. As before, MIC of the source, gate, and drain regions is conducted so as to provide those respective regions each with a polycrystalline phase, with the gate region further p-doped and having a large-grain polysilicon phase 64. The gate region typically has a width of about 0.1 to 5 microns.

The invention is now described with reference to certain examples that illustrate but do not limit it.

EXAMPLES

In order to investigate the effect of a native $SiO_2$ layer on MIC, two experiments were carried out. In the first experiment, three samples were prepared on Corning 7059 glass substrates in a multi-chamber plasma-enhanced chemical vapor deposition (PECVD) system. The samples consisted of 3000 Å thick undoped a-Si:H deposited on the glass substrate, which were then capped with 2000 Å thick sputtered Al. The base pressure prior to all depositions was in the range of $6 \times 10^{-8}$ torr. For the first sample, the Al was deposited right after (RA) the completion of the a-Si:H deposition. The sample remained under vacuum during preparation so it was not exposed to the atmosphere. For the second sample (10 M), the a-Si:H layer was exposed to room ambient for 10 minutes to allow for some native oxide layer to form prior to aluminum deposition. For the third sample (2 D), the a-Si:H layer was exposed to room ambient for 2 days to form an even thicker native oxide layer. The oxide layer thickness varied between 1.4–2.6 nm, as measured by the FTIR technique.

During a-Si:H deposition, the silane flow was 20 sccm and the plasma power density was 30 mW/cm2. The substrate temperature and chamber pressure were kept at 180° C. and 0.5 torr, respectively. During Al deposition, the Ar flow was 20 sccm and the substrate temperature and chamber pressure were kept at 40° C. and 5 mtorr, respectively. The RF power was maintained at 150 W. The deposition rate of Al was 2.2 Å/s.

For the second experiment, three more samples were prepared. The flow rates, substrate temperatures, plasma power and chamber pressure were all kept constant as described previously. The a-Si:H film in these samples was subjected to three different illumination environments while being exposed to room ambient for two days prior to Al deposition. The first sample was kept in the darkness for two days. The second sample was exposed to normal daylight for two days, and the third sample was exposed to a 10 W, 366 nm UV light for two days. Light is expected to enhance the growth of native oxide layer by removing H atoms from the H-terminated a-Si:H surface states, hence making it more susceptible to reaction with the ambient. Therefore, varying the illumination environment allows for varying native oxide thicknesses to grow on the a-Si:H surface.

Following fabrication, the samples were annealed in an optical annealing furnace in vacuum. The annealing temperatures were between 280–450° C. and the annealing time was always 20 minutes. The crystallinity of the samples was examined using a Phillips model X'pert X-ray diffraction (XRD) system by the glancing angle method using a 1.54 Å wavelength. A Hitachi model S-2300 scanning electron microscope (SEM) was used to examine the surface morphology of the various samples. The native oxide layer properties were measured by a spectroscopic ellipsometer (SE) combined with Fourier-transform infrared (FTIR) spectroscopy.

Results and Discussion

A. First Experiments

XRD Results

Figure 7:
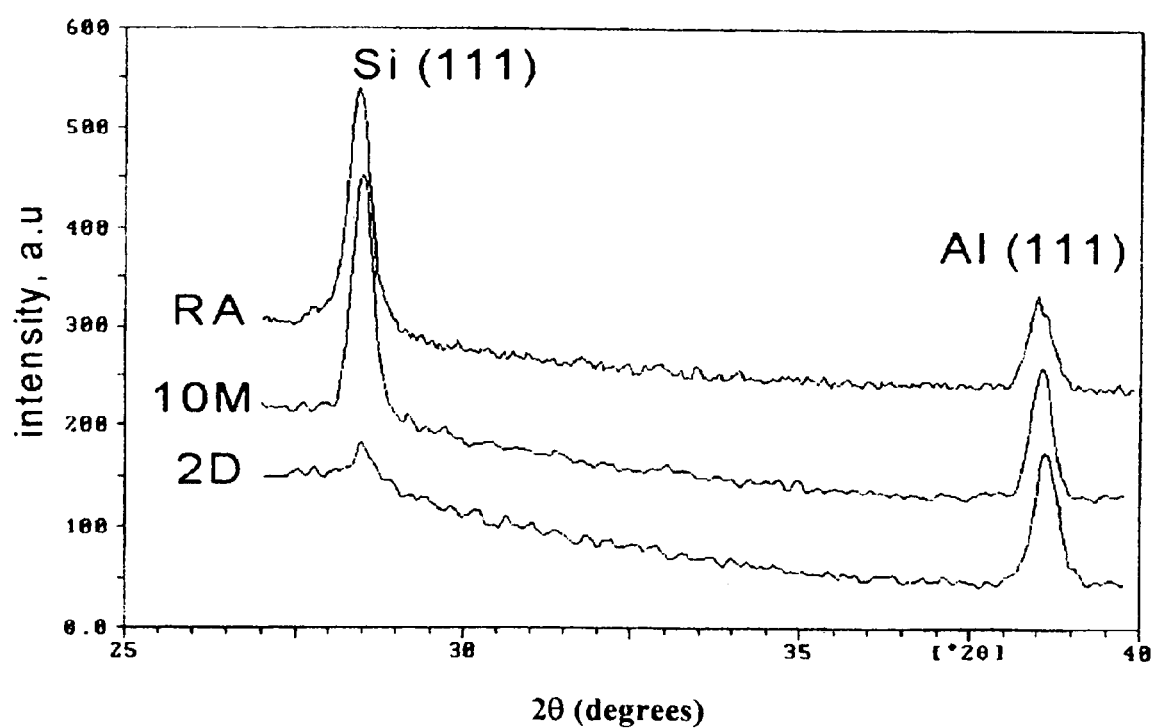
FIG. 7 shows glancing angle XRD spectra of RA, 10 M and 2 D samples. The RA (right after) sample was kept in vacuum and therefore does not have an oxide coat. The 10 M sample was exposed to ambient conditions for 10 minutes, and 2 D was exposed to ambient conditions for 2 days.

FIG. 7 shows X-ray diffraction 2θ plots for the three samples of the first experiment for an annealing temperature of 400° C. The peak at 28.45° is the Si (111) peak and the one at 38.5° is the Al (111) peak. The amount of crystallization in the a-Si:H layer is reflected in the area under the Si (111) peak. The RA curve is the XRD of the sample that was not at all exposed to room ambient, whereas the 10 M curve is that of the sample exposed to room ambient for 10 minutes. No significant difference in the crystallization rate of these two samples is observed. The 2 D curve is for the third sample in which the a-Si:H was exposed to air for 2 days. Crystallization of the a-Si:H layer was greatly retarded in this sample, most likely due to the presence of a thicker native oxide at the interface. The thickness of this native oxide layer was measured to be 1.4 nm by spectroscopic ellipsometry (SE) and Fourier transform infrared (FTIR) spectroscopy. It is worth noting that there is no significant difference in the Al (111) peaks for the different samples.

Figure 8:
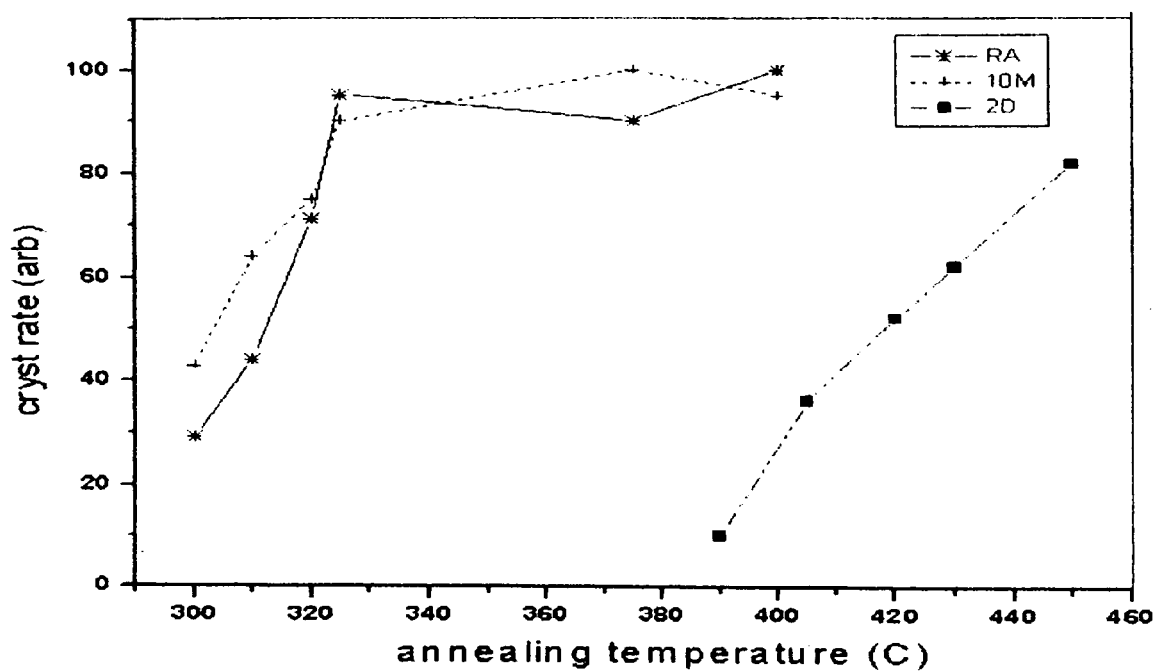
FIG. 8 shows growth of the Si (111) peak in the three samples as a function of annealing temperature. All data points were taken after 20 minutes annealing time.

FIG. 8 shows the growth rate of the Si (111) peak, determined by dividing the area under the Si (111) peak by the annealing time, versus annealing temperature. The crystallization rates for the RA and 10 M samples are virtually the same, while the growth rate of the 2 D sample is significantly less. This reduced crystallization is attributed to the presence of the native oxide layer. Also, eventually, all samples reach the same degree of crystallinity and the Si (111) peak, in all samples, saturates. This occurs when the a-Si:H layer is completely crystallized. The crystallization in the presence of a native oxide layer is consistent with that reported by Kim et al. However, it is believed that no previous study has shown that this native layer can actually impede the crystallization process. The slowing of crystallization in samples with a thicker native oxide layer is expected since interdiffusion of Al and Si atoms is believed to be the mechanism that drives the crystallization. Measurements of Al diffusion in $SiO_2$ [K. Kawagishi, et. al., *Elec. Chem. Soc. Proceed.* 97–31: 165, (1997); A. La Ferla, et al., *Nuclear Inst. and Meth. in Phys Res. B*, 116: 378 (1996)] and Si diffusion in $SiO_2$ [D. Tsoukalas, et al., *J. Appl. Phys.* 89(12): 7809 (2001)] have shown that they are actually very slow processes at these relatively low annealing temperatures, which leads to a slower overall interdiffusion process.

The crystallization rate in FIG. 8 was assumed to follow a thermally activated Arrhenius-type behavior. The activation energy for the crystallization process was calculated for all samples to be between 0.8 eV and 1.2 eV. These values are close to the values reported by Konno et al. for the activation energy of the process.

SEM Results

SEM pictures of the three samples, which differ only in the thickness of their native $SiO_2$ layer annealed at 400° C. for 20 minutes, were taken. Black features in the SEM photos are believed to be Si nodules protruding from the surface through the Al layer and the light-colored background is the Al layer. More black features are visible on the surface of the RA samples, while the number of these features is slightly less for the 10 M sample. The 2 D sample, on the other hand, shows still fewer features. Samples RA and 10 M were fully crystallized when the SEM micrographs were taken, while the 2 D sample was starting to crystallize. The 2 D sample, after it is fully crystallized, exhibits much larger features, which are believed to be Si grains or clusters of grains. The observation one can make about this is that samples with a thicker native oxide layer exhibit fewer, yet larger, grains, in good agreement with the Nast et al. report. They attributed this to the fact that thicker oxide barriers result in reduced nucleation rates and nucleation sites, which allow for Si grains to grow larger until they meet other grains at their grain boundaries.

The Al was then etched from the three samples using a standard etching solution; 85% phosphoric acid, 5% nitric acid, 5% acetic acid, and 5% DI water. SEM was then used to examine the exposed Si surface. The surface morphologies reveal that the RA sample has a Si surface heavily populated with small grains. The fully crystallized 2 D sample shows that the Si surface annealed at 450° C. yields much larger grains.

B. Second Experiments

XRD Results

Figure 9:
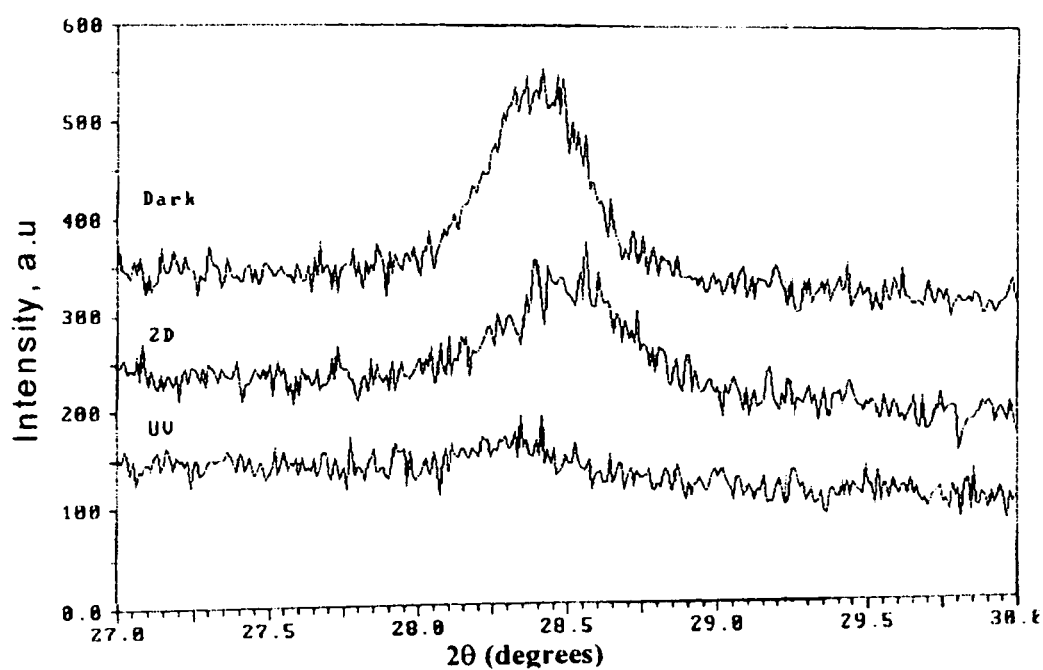
FIG. 9 shows glancing angle XRD identifying the Si (111) peak of the three samples of the second (illumination) experiment. The samples were annealed at 430° C. for 20 mins.

FIG. 9 shows XRD spectra of the Si (111) peak for the second set of samples. The samples are labeled Dark, 2 D, and UV in accordance with the illumination environment in which they were kept. The sample that was kept in darkness shows the most crystallization, as indicated by the size of its Si (111) peak, while the one that was kept under a UV light shows considerably less crystallization. The one kept in normal daylight shows intermediate crystallization. All three samples were annealed at 430° C. for 20 minutes.

Figure 10:
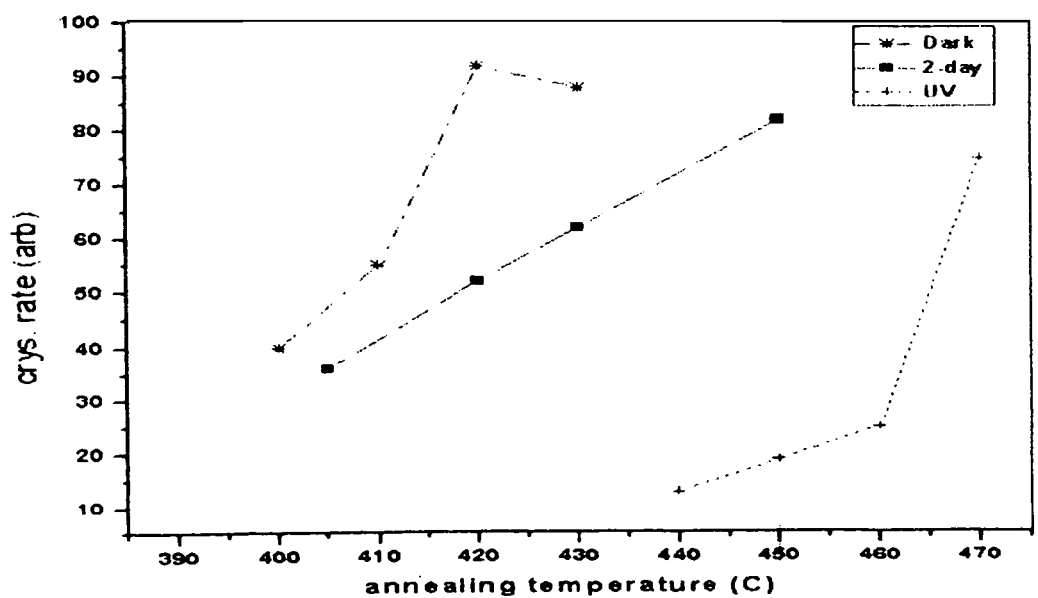
FIG. 10 shows growth of the Si (111) peak of the three illumination samples as a function of annealing temperature. Data points were taken after 20 mins annealing time.

The overall growth rate of the Si (111) peak of the samples with annealing temperature is shown in FIG. 10. The sample that was kept in darkness shows the fastest growth rate, followed by the one that was kept in daylight. The sample that was exposed to a UV light exhibits the slowest growth rate. Although it was kept in darkness, the dark sample still exhibits a slower crystallization rate, as compared to that of the RA and 10 M samples.

The slowing of crystallization in samples exposed to light is believed to be a result of an even thicker oxide layer whose growth was optically enhanced. It is believed that light can induce many chemical changes in an a-Si:H film [J. D. Joannopoulos et al., *The Physics of Hydrogenated amorphous Silicon II*, p 13, Springer-Verlag, Berlin (1984); R. A. Street, *Hydrogenated Amorphous Silicon*, Chap 2, Cambridge University Press, Cambridge (1991)], among them being enhancement of growth of native oxide by knocking H atoms off the H-terminated a-Si:H surface, which readily reacts with oxygen to form an even thicker oxide layer. This is a very plausible scenario since the bonding energy of the H-Si bond is in the range of 2.5–3 eV, and the energy of photons in the violet-ultraviolet region of the spectrum is 2.5–3.3 eV.

SEM Results

SEM micrographs of the three samples of the second experiment reveal large dark areas, which are clusters of grains of Si projecting through the Al layer. The large grains are a characteristic of all the samples. Grains as large as 10–15 µm across are visible, and this is believed to be due to a reduction in the number of nucleation sites in the a-Si:H film, which allow for the grains to grow larger. The silicon surface of samples were examined after the Al layer had been etched away and the large structures seen are believed to be Si grains that grew in size until they came into contact at the boundaries. Although the grains in the UV sample are very large, they were widely separated resulting in less crystallized volume in the a-Si:H film.

It must be mentioned that XRD performed on the interacted samples after etching away the Al revealed that no Al remained on the samples since the Al (111) at 38.5° was not detected. This means that the Al remaining in the a-Si:H layer is less than the detectable limit of the XRD system.

CONCLUSIONS

The effect of a native oxide layer on the MIC process has been studied. The study showed that the crystallization rate of a-Si:H is considerably less in the presence of a native oxide layer as was shown in the first experiment. The XRD plots showed how the rates varied as a result of different oxide thickness. The SEM micrographs showed how the Si surface morphology also varied as a function of the oxide thickness. Samples with thicker oxide yielded much larger feature sizes while samples with thinner oxides yielded rougher surfaces. In the second experiment, the thickness of the native oxide layer was optically controlled and the results again proved that samples with thicker oxide layers crystallize slower. The SEM micrographs agree with those of the first experiment that thick native oxide layers result in larger Si grains.

After studying the layer structure and the chemical composition of the samples using XTEM and SIMS, and after seeing the XRD and EDS results, which indicated that Al can be stripped from the films after crystallization, the results and findings can be summarized as follows:

1—The interacted samples in the Oxide samples are still made of two layers that are separated by a definite boundary as XTEM images revealed.

2—The EDS depth profiles show that the top portion of the sample (top ~150 nm) is composed primarily of Si. This top layer of Si has a thickness comparable to the thickness of the original Al that was on top. The Al layer is believed to have been displaced by the Si layer due to the layer exchange phenomenon.

3—The high resolution XTEM images showed that Si crystals (atomic planes) can be found almost in the entire film.

4—The high-resolution XTEM images could only show Al crystals at the boundary between the two poly-layers on the Al side.

5—SIMS depth profiles reveal results that are similar to EDS depth profiles in that a layer inversion in the top 150–170 nm of the film took place.

6—SIMS depth profiles of the etched samples revealed that the Al atomic concentration in the films is reduced to ~1%, a percentage that is too low for alloying yet too high for doping.

7—The RA samples showed much rougher surfaces and the Al concentration in the top 150 nm was significantly higher than in the Oxide sample.

When combined, these results combined imply that, although the top layer of the film is made of almost 70–90% silicon, Al can still be removed by wet etching. This phenomenon is illustrated schematically in FIG. 2, which shows the Oxide and the RA samples before annealing, after annealing and interaction, and after Al etching. The vertical lines indicate Al and horizontal dashed lines indicate Si. After annealing, layer inversion takes place between the top Al layer and some of the Si underneath.

Figure 2:
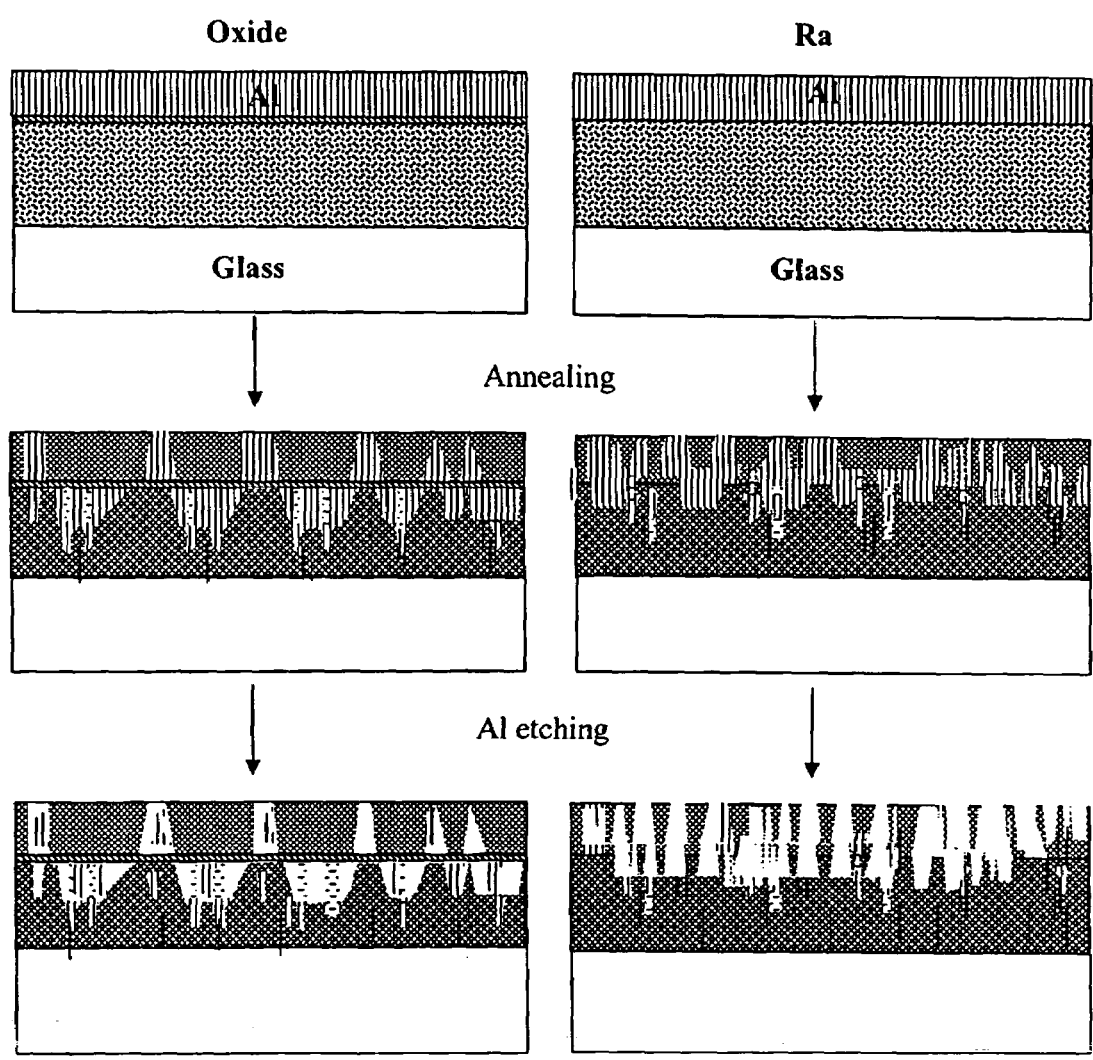
FIG. 2 shows a model depicting the different phases that an a-Si:H/Al construct goes through after annealing and Al etching for: no oxide barrier between the a-Si:H and Al phases (RA), and with thin $SiO_2$ phase between a-Si:H and Al (Oxide).

As seen in the SIMS and EDS depth profiles, the poly-Si layer formed by layer inversion is not 100% made of Si. Rather, it has 10–20% aluminum that may remain in the form of Al columns (channels) that extend through the first 150–170 nm of the film. These Al channels act like bridges that join the sample surface with the Al that has been displaced as a result of the layer inversion phenomenon. As depicted in FIG. 2, the Al channels and the displaced Al forms a semi-continuous layer of Al underneath the poly-Si formed by layer inversion. The Al at this stage is spread throughout the sample interior and all the way to the substrate. It also shows that the Al in the RA sample is randomly distributed in the first ~160 nm from the sample surface, while it is mostly concentrated under the interfacial oxide layer in the Oxide sample.

When applying the etch solution, the remaining Al channels are etched away. Consequently, the channels become devoid of Al, which allows the etch solution to go through the now hollow channels, and reach the Al that is inside the film. During this etching procedure, some Si may also be etched and washed away along with the etched Al. Eventually, most of the Al is etched away by this process except for 0.8–1.5% aluminum that remains in the poly-Si as a doping element. On the average, the etch solution reduces the Al concentration by a factor of 10 (one order of magnitude) throughout the film. The regions of the films that have the highest concentration of aluminum are still heavily doped with Al (the region right below the top poly-Si layer).

It is expected that the poly-Si, after the removal of Al, is somewhat porous. However, the porosity of the film doesn't seem to affect the integrity of the samples, especially the oxide samples. In the RA samples, the intermixing is expected to be more dramatic and Al is expected to be found in plentiful amounts in the top layer, as well as in the interior of the sample. Upon Al removal, the RA sample becomes more porous because of the random distribution of the Al throughout the film before removal. This, as mentioned previously, is a different scenario from the one that is found in the Oxide samples where the oxide layer keeps the poly-Si layer that formed on top of it, by the layer inversion process, separated from the Al that diffused through it to the other side.

This work demonstrates that MIC of a-Si:H is greatly affected by the quality of the Al/Si interface. It was first shown that the introduction of a thin oxide layer at the Al/Si interface gives rise to poly-Si thin films with smooth surfaces. Alternately, the absence of this oxide layer in the RA samples results in increased surface roughness. The samples that have oxide layers (Oxide Samples) also showed that film integrity is better maintained and can endure heat treatment without much peeling. Stress measurements, using XRD, showed that, as a result of annealing, the Oxide samples have less built-up stress in them as compared to the RA samples. The two different surface morphologies of the two types of samples were interpreted to be due to the presence of the oxide layer that acts as an interaction barrier between the two layers, which prevents intimate contact between them. This results in a poly-Si surface that suffers less from spiking, which is known to cause the Si surfaces to be rough.

SEM and AFM analysis showed that the Oxide samples are made of large and flat poly-islands as opposed to small and rough protrusions in the RA samples. Further AFM analysis revealed that the large islands are composed of what appears to be tightly packed small grains. These small grains are 50–150 nm in dimension.

Optical microscopy and SEM were then used to carry out a time study of the formation of the large islands. The study showed that the growth of the islands is quite fast and that the islands reach their maximum size in the first 5–10 minutes of annealing.

The crystallinity of the Oxide samples was then investigated by transmission electron microscopy (TEM). The TEM results revealed that the large islands are indeed large grains or made of large grains. Single grains, as large as 10 µm, were identified. TEM results also revealed that the Al that remained in the poly-Si films after Al etching is present either as a dopant or as inactive interstitial atoms, and not as bulk, since selected area diffraction (SAD) of the samples didn't show any traces of Al.

Cross-sectional TEM (XTEM) revealed that the Oxide samples are made of two layers even after annealing. High resolution XTEM revealed that the layers are still separated by a thin amorphous layer. XTEM images also revealed that poly-Si can be found throughout the film. EDS depth analysis of the layers revealed that the layers undergo a significant change in their chemical composition. The profiles showed that the top Al layer is replaced by poly-Si and the one underneath is a mixture of poly-Si and Al.

SIMS analysis of the samples also revealed that the interacted samples undergo a change in chemical composition. The analysis showed that the top Al layer is replaced by a layer that is composed of 80–90% Si. SIMS also revealed that the Al can be found diffused throughout the film and not as a layer. The results were used to calculate the diffusion coefficient of Al and the activation energy of the Al diffusion in a-Si:H. The activation energy was found to be 0.8 eV.

The present invention has been described with reference to certain examples for purposes of clarity and understanding. It should be appreciated, however, that improvements and modifications obvious to the skilled practitioner can be practiced within the scope of the appended claims.

What is claimed is:

1. A method of converting an amorphous region of a semiconductor to an at least partially crystalline region, said method comprising:
    at least partially oxidizing said amorphous region of the semiconductor;
    applying a contact metal to a surface of the at least partially oxidized amorphous region; and
    annealing the metallized semiconductor at a temperature of 150° to 450° C. to afford large grain crystallites and to convert said at least partially oxidized amorphous region to said at least partially crystalline region.

2. The method of claim 1, wherein the semiconductor is selected from the group consisting of silicon, germanium, silicon-germanium alloys, silicon-carbon alloys, germanium-carbon alloys, silicon-nitrogen alloys, gallium arsenide, cadmium telluride, copper-indium-diselenide, copper-indium-gallium-diselenide, copper-indium-disulfide, copper sulfide, copper telluride, zinc phosphide, indium selenide, and indium phosphide.

3. The method of claim 1, wherein the semiconductor is amorphous silicon (a-Si) and said at least partially crystalline region is polycrystalline silicon (poly-Si).

4. The method of claim 3, wherein the a-Si is hydrogenated.

5. The method of claim 1, wherein said at least partially crystalline region comprises the entirety of the semiconductor.

6. The method of claim 1, wherein said oxidizing is performed by contacting the semiconductor with ambient air.

7. The method of claim 6, wherein said oxidizing is performed under illumination.

8. The method of claim 1, wherein said oxidizing is performed by contacting the semiconductor with liquid water or water vapor.

9. The method of claim 1, wherein said applying of a contact metal is performed by chemical vapor deposition, plasma vapor deposition, evaporation, or sputtering.

10. The method of claim 1, wherein the contact metal is selected from the group consisting of aluminum, nickel, copper, silver, gold and palladium.

11. The method of claim 1, wherein said at least partially oxidized amorphous region has a thickness of 100 to 200,000 Å, more preferably 1000 to 20,000 Å.

12. The method of claim 1, wherein the contact metal is applied as a layer having a thickness of 10 to 20,000 Å, more preferably 100 to 10,000 Å.

13. The method of claim 1, wherein said annealing conditions include an annealing time in the range of 1 second to 1 day.

14. The method of claim 13, wherein the annealing time is in the range 1 minute to 1 hour.

15. The method of claim 1, wherein the at least partially crystalline region of the semiconductor has an average grain size in the range 1–20 microns.

16. The method of claim 1, wherein the at least partially crystalline region of the semiconductor is fully crystalline.

17. The method of claim 1, further comprising depositing the semiconductor onto a substrate prior to conducting said oxidizing.

18. The method of claim 17, wherein the substrate comprises glass, plastic, metal sheet or film, silicon or sapphire.

19. The method of claim 17, wherein said depositing is performed by chemical vapor deposition, plasma vapor deposition, evaporation or sputtering.

20. The method of claim 1, further comprising removing the contact metal from the semiconductor after annealing.

21. The method of claim 20, wherein said removing is performed by wet or dry etching.

22. The method of claim 1, wherein the semiconductor contains at least one dopant.

23. A semiconductor device formed by the method of claim 1.

24. The semiconductor device of claim 23, wherein the amorphous region of the semiconductor is a-Si and the at least partially crystallized region of the semiconductor is poly-Si.

25. A method of converting an amorphous region of a semiconductor to an at least partially crystalline region, said method comprising:
    depositing an oxide or nitride layer onto said amorphous region of the semiconductor;
    applying a contact metal to a surface of the deposited oxide or nitride layer; and
    annealing the metallized semiconductor at a temperature of 150° to 450° C. to afford large grain crystallites and to convert said amorphous region to said at least partially crystalline region.

26. The method of claim 25, wherein said depositing of oxide or nitride is performed by chemical vapor deposition or plasma vapor deposition.

27. The method of claim 25, wherein the oxide comprises an oxide of silicon, aluminum or other metal, and the nitride comprises a nitride of silicon, aluminum or other metal.

* * * * *